US012164102B2

(12) United States Patent
Kretzschmar et al.

(10) Patent No.: US 12,164,102 B2
(45) Date of Patent: Dec. 10, 2024

(54) METHOD FOR GENERATING A MATHEMATICAL MODEL FOR POSITIONING INDIVIDUAL MIRRORS OF A FACET MIRROR IN AN OPTICAL SYSTEM

(71) Applicant: Carl Zeiss SMT Gmbh, Oberkochen (DE)

(72) Inventors: Norman Kretzschmar, Aalen (DE); Ulrich Mueller, Aalen (DE); Markus Holz, Aalen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 564 days.

(21) Appl. No.: 17/524,080

(22) Filed: Nov. 11, 2021

(65) Prior Publication Data

US 2022/0066196 A1    Mar. 3, 2022

Related U.S. Application Data

(63) Continuation of application No. PCT/EP2020/062894, filed on May 8, 2020.

(30) Foreign Application Priority Data

May 13, 2019   (DE) .................... 10 2019 206 865.0

(51) Int. Cl.
| | | |
|---|---|---|
| G02B 26/08 | (2006.01) | |
| G02B 27/00 | (2006.01) | |
| G03F 7/00 | (2006.01) | |

(52) U.S. Cl.
CPC ..... G02B 26/0833 (2013.01); G02B 27/0012 (2013.01); G03F 7/70075 (2013.01);
(Continued)

(58) Field of Classification Search
CPC ............ G02B 26/0833; G02B 27/0012; G03F 7/70075; G03F 7/70141; G03F 7/705; G03F 7/7085; G03F 7/70116
See application file for complete search history.

(56) References Cited

U.S. PATENT DOCUMENTS

| | | | |
|---|---|---|---|
| 7,710,626 B2 | 5/2010 | Ito | |
| 9,581,912 B2 | 2/2017 | Hauf et al. | |
| (Continued) | | | |

FOREIGN PATENT DOCUMENTS

| | | |
|---|---|---|
| DE | 102012209412 A1 | 12/2013 |
| DE | 102014203189 A1 | 8/2015 |
| (Continued) | | |

OTHER PUBLICATIONS

International Search Report, PCT/EP2020/062894, Sep. 18, 2020, 4 pages.
(Continued)

*Primary Examiner* — Euncha P Cherry
(74) *Attorney, Agent, or Firm* — Edell, Shapiro & Finnan, LLC

(57) ABSTRACT

A method for generating a mathematical model (MM) for positioning individual mirrors (204, 204') of a facet mirror (200) in an optical system (500), e.g. in a lithography apparatus (100A, 100B). The method includes: a) providing (S701) target positions (SP) of the individual mirrors (204, 204') with an adjustment unit (502), b) capturing (S702) actual measurement positions (MI) of the individual mirrors (204, 204') with a measuring device (508), which is embodied as an interferometer, deflectometer and/or camera, and c) generating (S705) a mathematical model (MM) for positioning the individual mirrors (204, 204') based on the captured actual measurement positions (MI) and the target positions (SP). In step c), a difference (EA) is formed (S703) between a respective actual measurement position (MI) and a respec-
(Continued)

tive target position (SP) and the mathematical model (MM) is generated (S705) based on the difference (EA) formed.

16 Claims, 10 Drawing Sheets

(52) U.S. Cl.
CPC .......... *G03F 7/70141* (2013.01); *G03F 7/705* (2013.01); *G03F 7/7085* (2013.01)

(56) References Cited

U.S. PATENT DOCUMENTS

| | | | |
|---|---|---|---|
| 10,108,097 B2 | 10/2018 | Schoenhoff et al. | |
| 10,678,151 B2 | 6/2020 | Holz et al. | |
| 2010/0039629 A1 | 2/2010 | Xalter et al. | |
| 2012/0293784 A1* | 11/2012 | Xalter | G03F 7/70116 355/67 |
| 2016/0342095 A1 | 11/2016 | Bieling et al. | |
| 2017/0003489 A1 | 1/2017 | Steinborn et al. | |

FOREIGN PATENT DOCUMENTS

| | | |
|---|---|---|
| DE | 102016225900 A1 | 6/2018 |
| DE | 102016226079 A1 | 8/2018 |
| EP | 2511765 A2 | 10/2012 |
| EP | 3330762 A1 | 5/2019 |
| KR | 20070113114 A | 11/2007 |
| KR | 20150122722 A | 11/2015 |
| KR | 20170108027 A | 9/2017 |
| KR | 20180008316 A | 1/2018 |
| WO | 2010008993 A1 | 1/2010 |
| WO | 2018041670 A1 | 3/2018 |
| WO | 2018114816 A1 | 6/2018 |

OTHER PUBLICATIONS

Korean Office Action with English translation, Application No. 10-2021-7039915, Nov. 22, 2023, 11 pages.

* cited by examiner

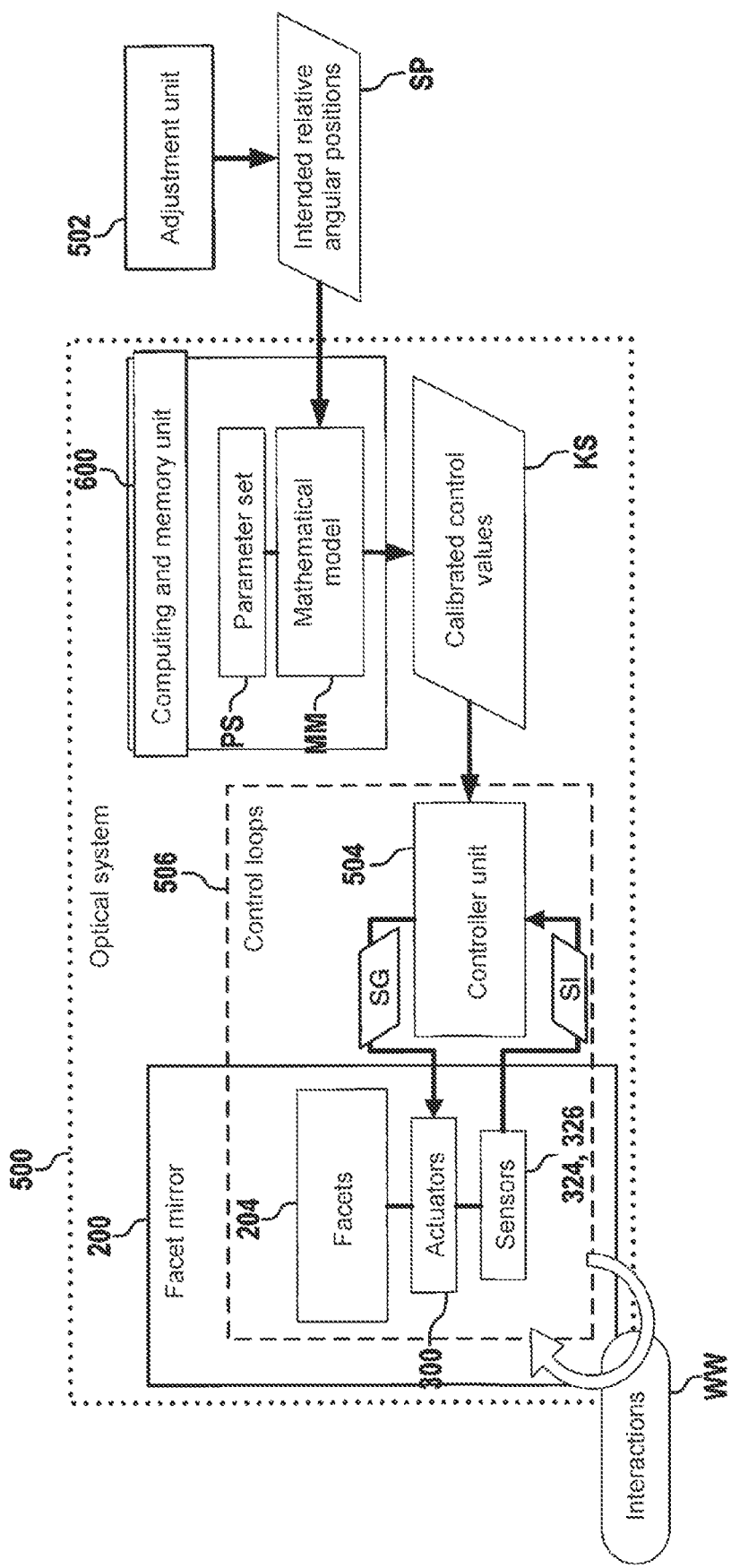

METHOD FOR GENERATING A MATHEMATICAL MODEL FOR POSITIONING INDIVIDUAL MIRRORS OF A FACET MIRROR IN AN OPTICAL SYSTEM

CROSS REFERENCE TO RELATED APPLICATIONS

This is a Continuation of International Application PCT/EP2020/062894, which has an international filing date of May 8, 2020, and which claims the priority of German Patent Application 10 2019 206 865.0, filed May 13, 2019. The disclosures of both applications are incorporated in their respective entireties into the present Continuation by reference.

FIELD OF THE INVENTION

The present invention relates to a method for generating a mathematical model for positioning individual mirrors of a facet mirror in an optical system, to a method for positioning individual mirrors of a facet mirror in an optical system, to an optical system and to a lithography apparatus.

BACKGROUND

Microlithography is used for producing microstructured components, such as for example integrated circuits. The microlithography process is performed using a lithography apparatus, which has an illumination system and a projection system. The image of a mask (reticle) illuminated by the illumination system is in this case projected by the projection system onto a substrate, for example a silicon wafer, which is coated with a light-sensitive layer (photoresist) and arranged in the image plane of the projection system, in order to transfer the mask structure to the light-sensitive coating of the substrate.

Extreme Ultraviolet (EUV) lithography apparatuses operate using radiation at extremely short wavelengths. An exemplary wavelength is at 13.5 nm. Since the materials available for the production of refractive optical components, such as lenses, are opaque to EUV radiation, EUV lithography apparatuses are constructed at least predominantly from mirrors.

The illumination system of EUV lithography apparatuses, i.e., between the radiation source and the projection system (also referred to as "projection lens"), contains facet mirrors. A facet mirror is a mirror whose reflecting surface is formed by a multiplicity of individual mirrors, which are referred to as facets in the present description.

In the case of facet mirrors for EUV applications, the correct relative angular position of the individual facets of each facet mirror is important for the quality of the beam shaping. What should be considered here is that the individual facets of an individual facet mirror can have different relative angular positions relative to one another, and each relative angular position of each facet must be adjusted correctly in relation to the global coordinate system for the proper function of the facet mirror in the optical system.

However, there increasingly is the need to be able to tilt the individual facets in order thereby to be able to set, e.g., a different illumination setting during the operation of the lithography apparatus. In this respect, WO 2010/008993 A1 discloses a measurement apparatus for facilitating the measurement of the relative angular positions of the tiltable facets during the operation of the projection exposure lens.

DE 10 2012 209 412 A1 describes a further optical method for measuring relative angular positions of facets of a facet mirror of an optical system designed for EUV applications and for subsequently adjusting the relative angular positions on the basis of the deviation between measured actual relative angular positions and specified intended relative angular positions.

WO 2018/041670 A1 describes a control device for an assembly having a plurality of sensors and actuators, in particular for a facet mirror of an illumination optical unit.

The measuring methods and control devices specified in the prior art do not consider any interactions between the various control loops for setting the relative angular positions of the facets of a facet mirror. In this case, the interactions may be based on various physical mechanisms, for instance electromagnetic signal crosstalk which leads to reciprocal interference in signal amplitudes, signal frequencies or signal phase angles, or reciprocal optical interferences (e.g., stray light), or mechanical stresses and deformations. Source of these interactions and the component parts affected by the resultant interference can be different components of the control loops, for instance the actuators and sensors which are both required for closed-loop control of the relative angular positions of the facets.

In practice, these interactions lead to deviations between the actual relative angular positions and the intended relative angular positions of the individual facets as specified by the illumination setting, with the deviations themselves depending on the illumination setting set. These deviations are often located above the required specifications in this case, and so the latter can no longer be fulfilled.

Moreover, which illumination settings final users of the lithography apparatus (customers) will set in future is not known in advance. It is even more difficult to control the possible deviations between intended and actual relative angular positions on account of the very large number of conceivable illumination settings.

SUMMARY

Against this background, it is an object of the present invention to make available an improved method and an improved optical system.

Accordingly, a method is proposed for generating a mathematical model for positioning individual mirrors of a facet mirror in an optical system, in particular for a lithography apparatus, the optical system comprising:
  a facet mirror with individual mirrors,
  actuators which are configured to position the individual mirrors on the basis of manipulated variables,
  sensors which are configured to capture sensor actual positions of the individual mirrors,
  an adjustment unit which is configured to provide intended positions of the individual mirrors, and
  a controller unit which is configured to provide the manipulated variables on the basis of the provided intended positions and the captured sensor actual positions,
wherein the method includes the steps of:
  a) providing the intended positions of the individual mirrors with the aid of the adjustment unit,
  b) capturing measurement actual positions of the individual mirrors with the aid of a measuring device, and
  c) generating a mathematical model for positioning the individual mirrors on the basis of the captured measurement actual positions and the intended positions.

The measurement actual positions captured by the measuring device have a greater accuracy than the sensor actual positions. This is due to the fact that the measuring device is not exposed to any relevant extent to potential interference sources from the optical system, for instance electric fields, which may lead to crosstalk, on account of said measuring device not being a constituent part of the optical system as such and therefore being able to be arranged outside of same, in particular, during the capture of the measurement actual positions.

Consequently, this advantageously allows prediction and correction of, in particular, the deviations occurring between the actual relative angular positions of the facets of a facet mirror and the intended relative angular positions specified by the illumination setting, without being dependent on a comprehensive measurement of all conceivable illumination settings. As a result, the intention is to significantly reduce or completely remove these deviations which depend on the illumination setting chosen by the final user.

By way of example, the facet mirror may contain more than 100 or 1000 facets (individual mirrors). In particular, it may be provided as a part of the illumination system of a lithography apparatus.

A coil, an electromagnet or Lorenz actuator is an example of an actuator. In particular, the actuator may comprise a permanent magnet which is deflected in a current-induced magnetic field and which can preferably be embodied as a voice coil actuator.

An inductive sensor, a capacitive sensor or an optical sensor is an example of a sensor.

A controller which provides specified values (intended positions) of the individual mirrors on the basis of a set illumination setting during the exposure is an example of an adjustment unit.

A PID controller (proportional-integral-derivative controller) consisting of components of a P member, an I member and a D member is an example of a control unit.

Step a) preferably comprises the provision of a plurality of sets of intended positions. Each set comprises the intended positions of all individual mirrors for one illumination setting (corresponding to one point in time). The plurality of sets correspond to a plurality of illumination settings (which the individual mirrors can adopt at different times).

Accordingly, step b) preferably comprises the capture of a plurality of sets of measurement actual positions. Each set comprises the captured or measured measurement actual positions of all individual mirrors for one illumination setting (corresponding to one point in time). The plurality of sets correspond to a plurality of illumination settings (which the individual mirrors can adopt at different times).

Steps a) and b) are preferably carried out iteratively, i.e., a first set of intended positions is provided in step a), then the corresponding first set of measurement actual positions is captured in step b), then a second set of intended positions is provided, then the corresponding second set of measurement actual positions is captured in step b), etc.

Steps a) and b) are repeated until the desired number of sets of intended positions and measurement actual positions has been worked through. By way of example, steps a) and b) are each run through at least 10, 100 or 1000 times. Step c), that is to say the ascertainment of the mathematical model on the basis of the captured sets of intended positions and measurement actual positions, is only implemented subsequently. Alternatively, step c) can be implemented after each step b) and the mathematical model can be adapted on the basis of each further set of intended positions and measurement actual positions.

According to one embodiment, the mathematical model considers an interaction between at least two components of the optical system.

The interaction can be an electrical interaction, magnetic interaction, mechanical interaction and/or optical interaction between the at least two components. The electrical and/or magnetic interaction is caused by a superposition of an electric and/or magnetic field of a first of the at least two components on an electric and/or magnetic field of a second of the at least two components. Mechanical interaction arises from reciprocal mechanical influencing (stress or deformation) of at least the first and second component. The optical interaction is the result of reciprocal optical influencing (e.g., as a result of stay light) of the at least two components.

The at least two components preferably belong to different control loops of the optical system. Each of these control loops comprises at least an actuator and a sensor, but also appropriate electrical and/or optical connections (e.g., signal lines) or components (e.g., microprocessors, common potentials or HF (high-frequency) generators).

According to a further embodiment, the interaction is crosstalk.

By way of example, the crosstalk is electromagnetic signal crosstalk, which leads to reciprocal interference in signal amplitudes, signal frequencies and/or signal phase angles.

According to a further embodiment, the at least two components are two sensors, two actuators, one actuator and one sensor or electrical and/or optical connections or components assigned thereto in each case.

The sensors, actuators and connections or components respectively assigned thereto preferably belong to the aforementioned different control loops.

For the positioning of a respective individual mirror according to a further embodiment, the mathematical model only considers properties of other individual mirrors of the same type or actuators and/or sensors assigned thereto.

By way of example, the individual mirrors can correspond to 2 or more different types. By contrast, the same type means that the individual mirrors or the actuators and/or sensors assigned thereto are equivalent in terms of their construction or control. By way of example, the same construction may be present if the respective sensor axes (chief measurement direction which is specified by one or more electrical coils of the sensor, for example) have the same orientation in space. By way of example, the same control may be present if a control frequency of the sensors corresponds or is located in an overlapping range.

According to a further embodiment, the properties include an orientation of and/or a distance of the other individual mirrors or of the actuators and/or sensors assigned thereto from the respective individual mirror or an actuator and/or sensor assigned thereto.

In particular, orientation (in relation to the orientation of the sensor axes) means an alignment of the other individual mirrors (actuators, sensors) in space (but not the actual position). The properties of orientation and distance are particularly decisive for reciprocal influencing of the components and arise from the optical design of the facet mirror.

According to a further embodiment, a difference is formed between a respective measurement actual position and a respective intended position, and the mathematical model is generated on the basis of the difference formed.

The mathematical model is generated in such a way that it approximates the difference to the best possible extent.

According to an embodiment, the mathematical model is generated iteratively.

An iterative generation is regularly required because so-called fit parameters are adapted in order to approximate the aforementioned difference to the best possible extent.

According to a further embodiment, the mathematical model is generated with the aid of a numerical process, in particular the method of least squares.

According to a further embodiment, the measuring device measures the optical measurement actual positions optically.

By way of example, the measuring device can be an interferometer, a deflectometer or a camera, in particular a CCD (charge-coupled device) camera. Advantageously, optical measuring devices can be arranged far away from the optical system, and hence as uninfluenced by the latter as possible, so that the measurement actual positions can be measured accurately.

According to a further embodiment, the sensor actual positions, measurement actual positions and the intended positions are relative angular positions of the individual mirrors.

According to a further aspect, the following is provided: a method for positioning individual mirrors of a facet mirror in an optical system, in particular in a lithography apparatus, the optical system comprising:
  a facet mirror with individual mirrors,
  actuators which are configured to position the individual mirrors on the basis of manipulated variables,
  sensors which are configured to capture sensor actual positions of the individual mirrors,
  an adjustment unit which is configured to provide intended positions of the individual mirrors, and
  a controller unit which is configured to provide the manipulated variables on the basis of the provided intended positions, the captured sensor actual positions and a mathematical model, wherein the mathematical model was generated as described above,
wherein the method includes the steps of:
  a) providing the intended positions of the individual mirrors with the aid of the adjustment unit,
  b) capturing the sensor actual positions of the individual mirrors with the aid of the sensors, and
  c) providing the manipulated variables on the basis of the provided intended positions, the captured sensor actual positions and the mathematical model with the aid of the control unit.

By virtue of the mathematical model being generated at the manufacturer of the optical system, said model can then be readily used at the final user or customer (in particular chip manufacturer) to ensure that there is the best possible closed-loop control despite inaccurate (measured) actual positions-in particular as a result of crosstalk. This also applies to illumination settings which are unknown to the manufacturer but advantageous for the customer.

According to an embodiment, the intended positions provided by the adjustment unit are calibrated with the aid of the mathematical model and the control unit provides the manipulated variables on the basis of the calibrated intended positions and the captured sensor actual positions.

Thus, in this approach, the manipulated variables provided (i.e., the closed-loop control of the actuators) is adapted by virtue of the intended positions already being corrected with the aid of the mathematical model. By way of example, this can be implemented with the aid of a correction unit which, in particular, is in the form of a microprocessor with an assigned memory.

According to a further aspect, the following is provided: an optical system, in particular for a lithography apparatus, comprising:
  a facet mirror with individual mirrors,
  actuators which are configured to position the individual mirrors on the basis of manipulated variables,
  sensors which are configured to capture sensor actual positions of the individual mirrors,
  an adjustment unit which is configured to provide intended positions of the individual mirrors, and
  a controller unit which is configured to provide the manipulated variables on the basis of the provided intended positions, the captured sensor actual positions and a mathematical model, wherein the mathematical model is generated as described above.

Further, a lithography apparatus comprising an optical system, as described above, is provided.

"A (n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

The embodiments and features described for the proposed methods are correspondingly applicable to the proposed optical system and to the proposed lithography apparatus, and vice versa.

Further possible implementations of the invention also comprise not explicitly mentioned combinations of features or embodiments that are described above or below with respect to the exemplary embodiments. In this case, a person skilled in the art will also add individual aspects as improvements or supplementations to the respective basic form of the invention.

Further advantageous configurations and aspects of the invention are the subject matter of the dependent claims and also of the exemplary embodiments of the invention described below. In the text that follows, the invention is explained in more detail on the basis of preferred embodiments with reference to the accompanying figures.

BRIEF DESCRIPTION OF THE DRAWINGS

FIG. 6 shows an optical system according to one embodiment, for example as supplied to a customer;

DETAILED DESCRIPTION

Unless indicated to the contrary, elements that are the same or functionally the same have been provided with the same reference signs in the figures. It should also be noted that the illustrations in the figures are not necessarily true to scale.

Figure 1A:
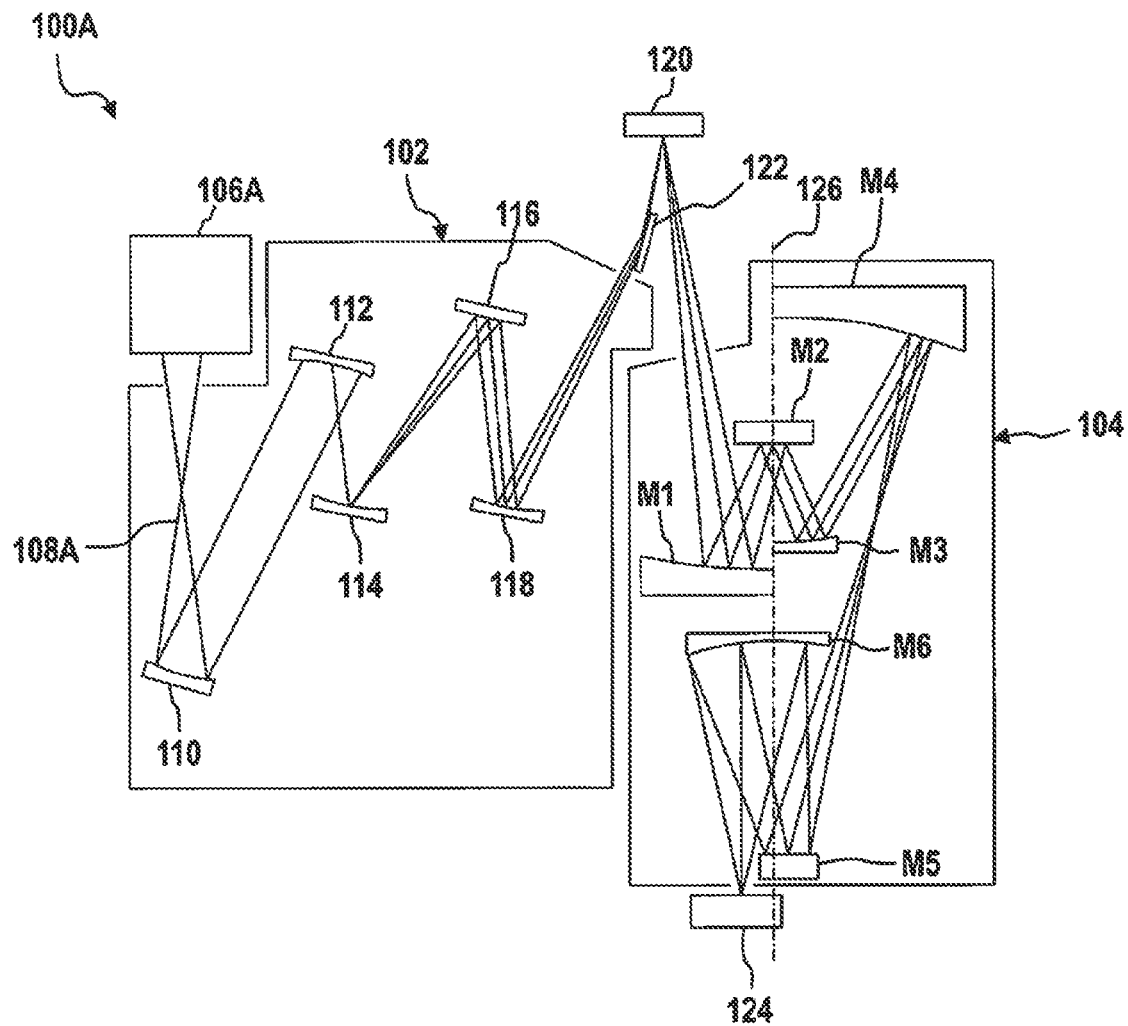
FIG. 1A shows a schematic view of one embodiment of an EUV lithography apparatus.

FIG. 1A shows a schematic view of an EUV lithography apparatus 100A comprising a beam-shaping and illumination system 102 and a projection system 104. In this case, EUV stands for "extreme ultraviolet" and denotes a wavelength of the working light of between 0.1 nm and 30 nm. The beam-shaping and illumination system 102 and the projection system 104 are respectively provided in a vacuum housing (not shown), wherein each vacuum housing is evacuated with the aid of an evacuation device (not shown). The vacuum housings are surrounded by a machine room (not shown), in which drive devices for mechanically moving or setting optical elements are provided. Moreover, electrical controllers and the like may also be provided in this machine room.

The EUV lithography apparatus 100A comprises an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam-shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam-guiding spaces in the beam-shaping and illumination system 102 and in the projection system 104 are evacuated.

The beam-shaping and illumination system 102 illustrated in FIG. 1A has five mirrors 110, 112, 114, 116, 118. After passing through the beam-shaping and illumination system 102, the EUV radiation 108A is guided onto a photomask (reticle) 120. The photomask 120 is likewise formed as a reflective optical element and may be arranged outside the systems 102, 104. Furthermore, the EUV radiation 108A may be directed onto the photomask 120 with a mirror 122. The photomask 120 has a structure which is imaged onto a wafer 124 or the like in a reduced fashion by the projection system 104.

The projection system 104 (also referred to as a projection lens) has six mirrors M1 to M6 for imaging the photomask 120 onto the wafer 124. In this case, individual mirrors M1 to M6 of the projection system 104 may be arranged symmetrically in relation to an optical axis 126 of the projection system 104. It should be noted that the number of mirrors M1 to M6 of the EUV lithography apparatus 100A is not restricted to the number shown. A greater or lesser number of mirrors M1 to M6 may also be provided. Furthermore, the mirrors M1 to M6 are generally curved at their front side for beam shaping.

Figure 1B:
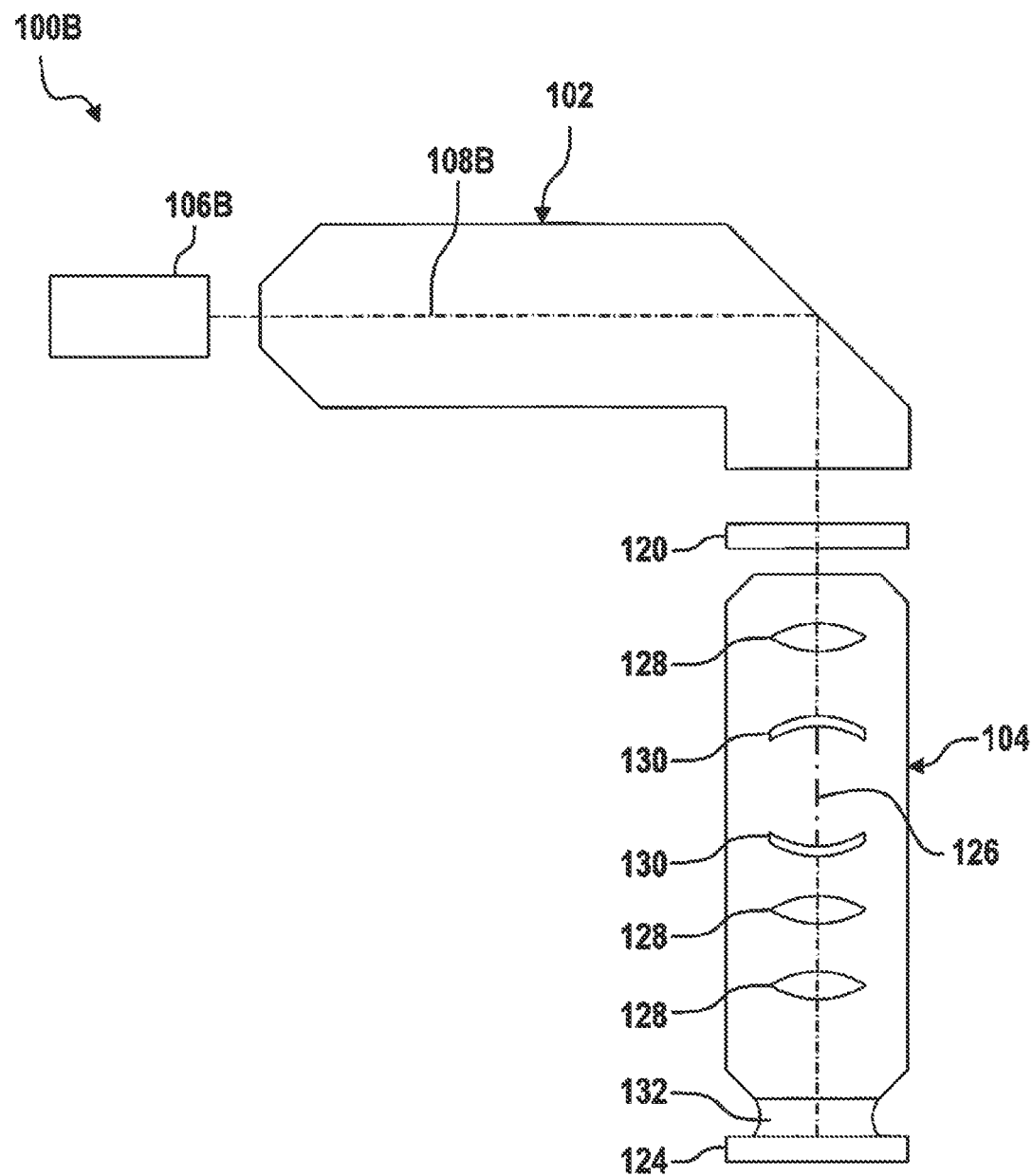
FIG. 1B shows a schematic view of one embodiment of a DUV lithography apparatus.

FIG. 1B shows a schematic view of a DUV lithography apparatus 100B, which comprises a beam-shaping and illumination system 102 and a projection system 104. In this case, DUV stands for "deep ultraviolet" and denotes a wavelength of the working light of between 30 nm and 250 nm. As has already been described with reference to FIG. 1A, the beam-shaping and illumination system 102 and the projection system 104 may be arranged in a vacuum housing and/or be surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam-shaping and illumination system 102 illustrated in FIG. 1B guides the DUV radiation 108B onto a photomask 120. The photomask 120 is formed as a transmissive optical element and may be arranged outside the systems 102, 104. The photomask 120 has a structure which is imaged onto a wafer 124 or the like in a reduced fashion by the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number represented. A greater or lesser number of lens elements 128 and/or mirrors 130 can also be provided. Furthermore, the mirrors 130 are generally curved at their front side for beam shaping.

An air gap between the last lens element 128 and the wafer 124 can be replaced by a liquid medium 132 having a refractive index of >1. The liquid medium 132 may be for example high-purity water. Such a set-up is also referred to as immersion lithography and has an increased photolithographic resolution. The medium 132 can also be referred to as an immersion liquid.

Figure 2:
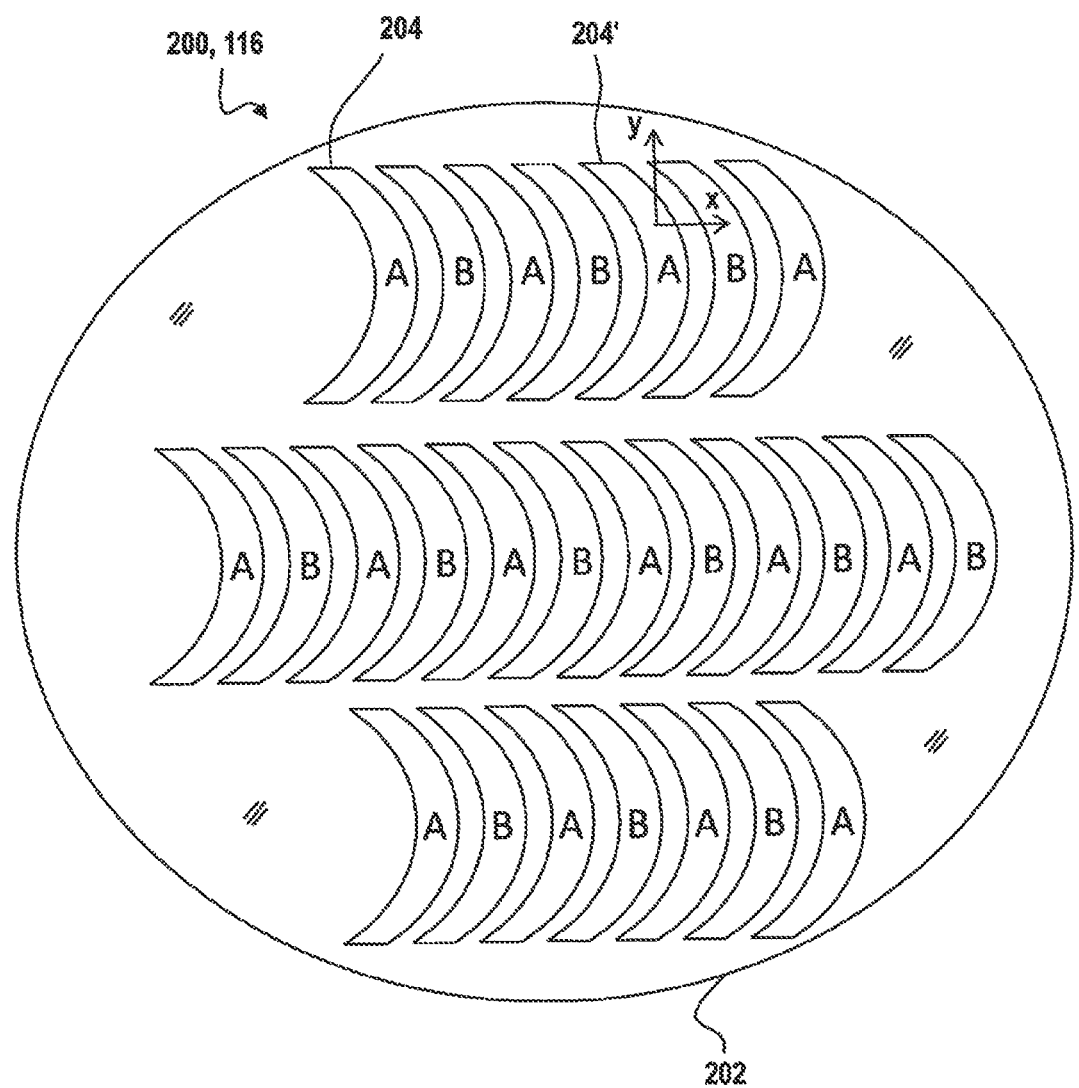
FIG. 2 shows a plan view of a facet mirror according to one embodiment.

FIG. 2 shows a plan view of a facet mirror 200, which may be the facet mirror 116 of the illumination system 102 from FIG. 1A, for example. A support plate 202 that is covered with a multiplicity of facets 204 is identifiable. By way of example, the facet mirror 200 can have more than 100 or more than 1000 facets 204 and in particular have a diameter of 50 cm and more. By way of example, a respective facet 204 can be embodied in the form of a ring segment. The facets 204 are configured to reflect working light, in particular the EUV working light 108A of FIG. 1A. The working light is shaped in suitable fashion with the aid of the facets 204 such that an advantageous light distribution is obtained in space. This is directed in turn to the desired illumination setting or the specific exposure task on the wafer 124. Dipole and quadrupole settings are known as examples of an illumination setting.

Each of the facets 204 is provided to be tiltable about two mutually orthogonal axes x, y such that the working light, in particular the EUV working light 108A, can be directed at different targets, for example on the facet mirror 118 (see FIG. 1A). By way of example, the plane spanned by the axes x, y can be provided parallel to the support plate 202.

Figure 3:
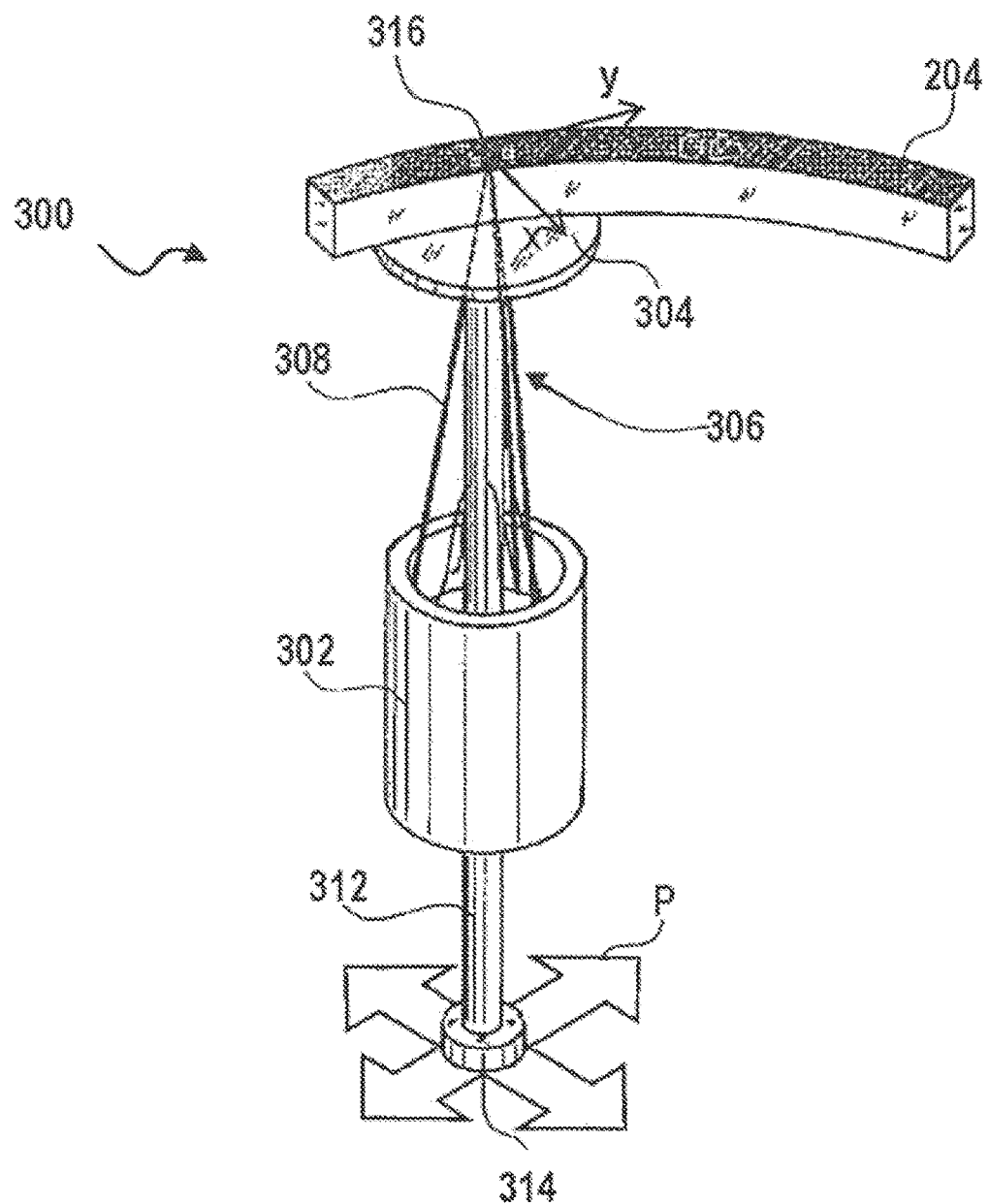
FIG. 3 illustrates parts of a voice coil actuator according to one embodiment in a perspective view.

FIG. 3 illustrates parts of a voice coil actuator 300 in a perspective view, the latter being configured to tilt one of the facets 204 of FIG. 2 about the x, y axes. In principle, such a voice coil actuator is known from DE 10 2016 225 900 A1, which is why it is only explained briefly below. However, any other suitable actuator (in particular coil actuator) could also find use.

The voice coil actuator 300 comprises a securing sleeve 302 that is securely arranged on the support plate 202. A carrier element 304 bears against said securing sleeve by way of a flexure 306 with legs 308. A facet 204 is fastened to the top side of the carrier element 304. On the lower side, an actuating rod 312 engages on the carrier element 304, said actuating rod carrying at its lower end a magnetic end piece 314 (permanent magnet). A deflection of the end piece 314 in the directions denoted by P in FIG. 3 leads to a tilt of the facets 204 about the axes x, y at a tilt point 316.

Figure 4:
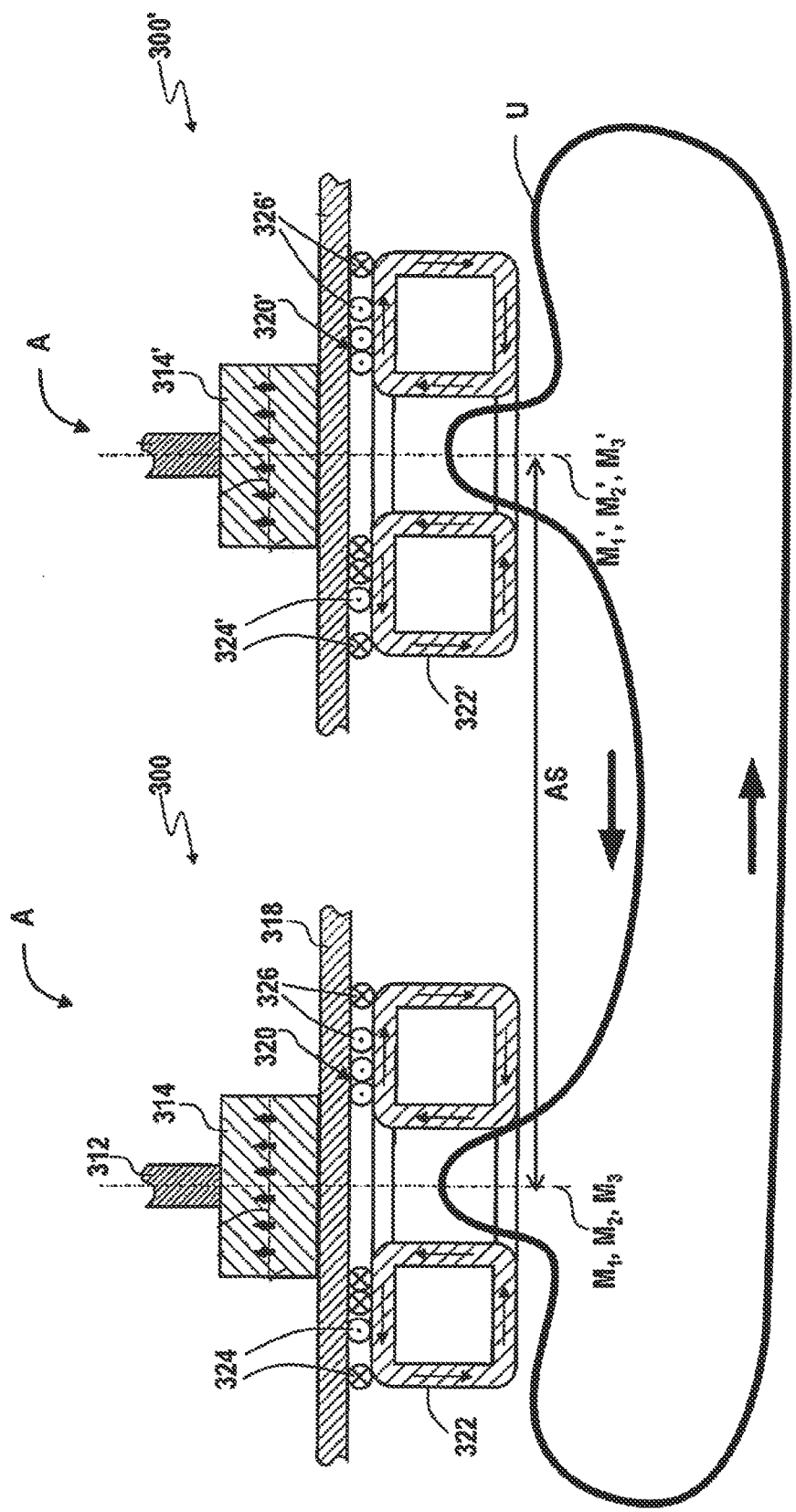
FIG. 4 is a sectional illustration of further parts of the voice coil actuator from FIG. 3.

FIG. 4 shows a sectional illustration of further parts of the voice coil actuator 300. Actuator coils 320, 322 and sensor coils 324, 326 are optionally arranged below a separating surface 318. According to the exemplary embodiment, the actuator coil 320 is a flat coil and the actuator coil 322 is a toroid coil. The sensor coils 324, 326 are each in the form of flat coils, in particular. The center axes M1, M2 of the actuator coils 320, 322 are arranged coaxially. In the rest position of the end piece 314, the center axis M3 thereof is also arranged coaxially with the center axes M1, M2. By feeding current to the actuator coils 320, 322 the end piece 314 can be moved in such a way that the facet 204 tilts about the axes x, y.

For the purposes of controlling a facet 204' (see FIG. 2) arranged next to the facet 204, a further voice coil actuator 300' is arranged next to the voice coil actuator 300 (see FIG. 4). In the process, there can now be electric and/or magnetic crosstalk between the respective coils 320, 320', 322, 322', 324, 324' and 326, 326', as indicated by the closed field line U in FIG. 4. That is to say the respective magnetic fields become superposed. If current induced on account of the movement of the end piece 314, 314' into the sensor coils 324, 324', 326, 326' is evaluated in evaluation electronics as a measure for the actual position of the end piece 314, 314', and hence of the facets 204, 204', the consequence of this crosstalk is that the (true) actual position is only captured inaccurately and the facets 204, 204' do not adopt the desired intended position.

Figure 5:
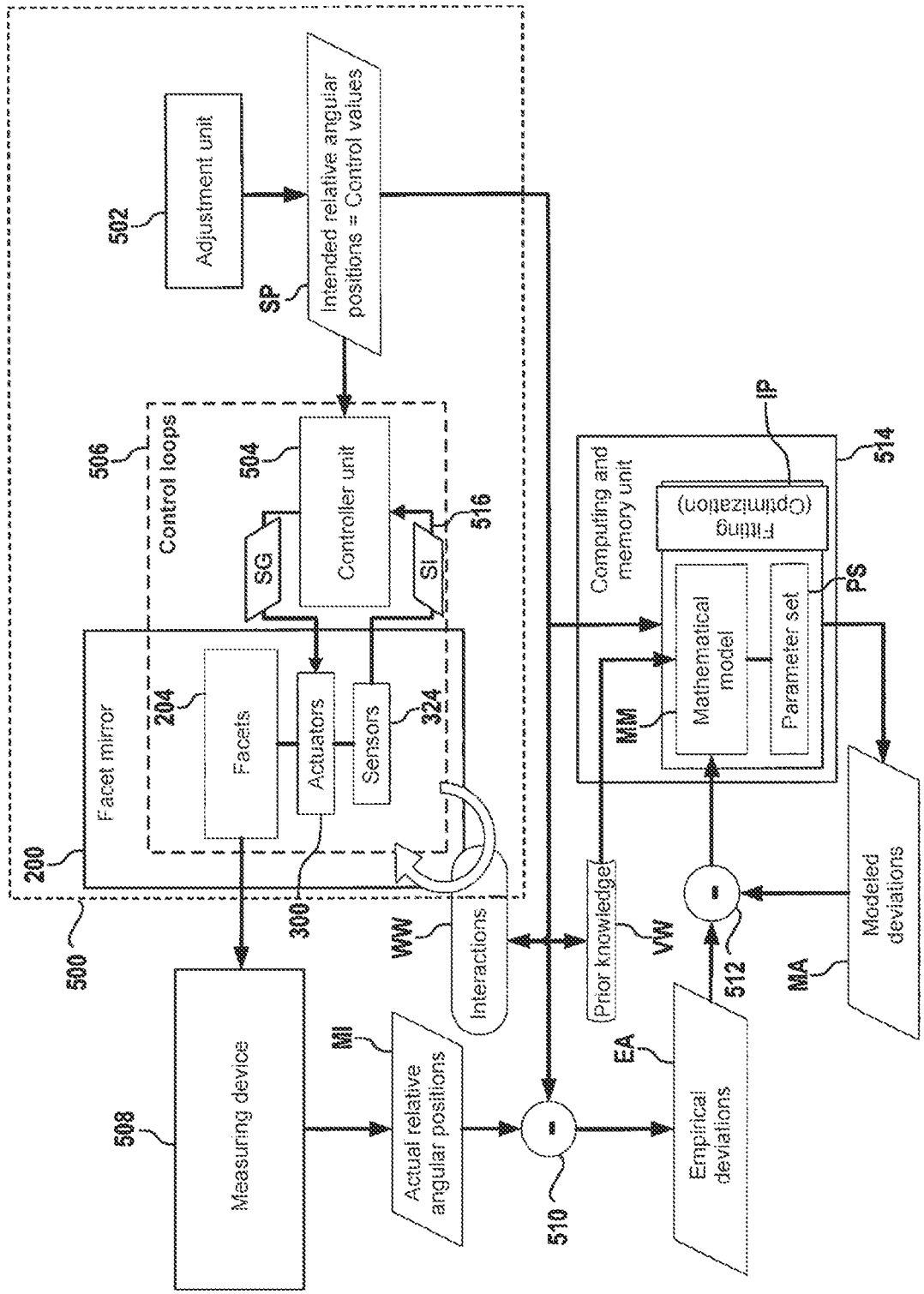
FIG. 5 shows, in the form of a block diagram, an optical system according to one embodiment, as may be provided at a manufacturer of the system for example.

FIG. 5 shows, in the form of a block diagram, an optical system 500 which is used for example in one of the lithography apparatuses 100A, 100B. By way of example, the optical system 500 comprises the facet mirror 200 which was described in conjunction with FIG. 2. The facet mirror 200 comprises facets 204, 204' (also denoted jointly by "204" only in the present case). The facets 204 are positionable, in particular tiltable, with the aid of actuators 300, 300' (also denoted jointly by "300" only in the present case) as described in conjunction with FIGS. 3 and 4, for example. The positioning by the actuators 300 is implemented on the basis of manipulated variables SG. In addition to the actuators 300 the optical system 500 comprises sensors 324, 326, 324', 326' (also denoted jointly by "324" only in the present case) which may be designed as described in the context of FIG. 4, for example. In very general terms, capacitive, inductive or optical sensors, in particular, may be considered here. The sensors 324 are configured to capture sensor actual positions SI of the facets 204, especially actual relative angular positions in this case. Further, an adjustment unit 502 is provided, the latter providing an illumination setting in the form of intended positions SP, especially intended relative angular positions in this case. A controller unit 504 provides the manipulated variables SG on the basis of the provided intended positions SP and the captured sensor actual positions SI.

The facets 204, actuators 300, sensors 324 and control unit 504 form a plurality of control loops 506, with a respective control loop 506 having at least one of each of these components. The above-described interaction WW may arise between these control loops 506, in particular crosstalk between the sensors 324, 326, 324', 326' of the different control loops 506, and so the sensor actual positions SI do not have the required accuracy.

Figure 5A:
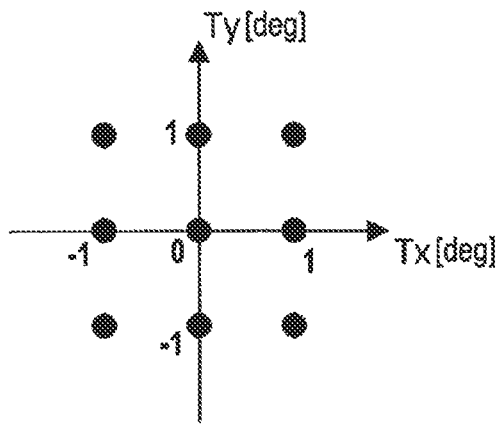
FIG. 5A shows a grid of equidistant relative angular positions.

In this respect the following is provided:

The optical system (see FIG. 5) is constructed at the manufacturer. The adjustment unit 502 controls the control unit 504 with the intended positions SP according to various predefined illumination settings (step S701 in FIG. 7). In this case, each illumination setting comprises a set of intended positions SP, that is to say an intended position SP for each facet 204. The choice of illumination settings to be measured can be implemented on the basis of various selection rules: canonical, generally known standard settings. Alternatively, a number of predefined standard relative angular positions, which are also applied in the final use (the customer), are selected sequentially for each of the individual facets 204. Further, a grid of equidistant relative angular positions can be selected sequentially for each of the individual facets 204. That is to say that, as illustrated in FIG. 5A, relative angular positions (a relative angular position being defined by the deflections Tx and Ty about the x and y axis, respectively—cf. FIG. 3) are selected in succession, said relative angular positions corresponding, e.g., to the value pairs Tx=[−1°, 0°, +1°]×Ty=[−1°, 0°, +1°], that is to say for example nine different relative angular positions.

Further, a measuring device 508 is constructed, the latter being arranged, in particular, outside of—from a spatial point of view—the optical system 500. The measuring device 508 captures actual positions of the facets 204 in the form of measurement actual positions MI (step 702 in FIG. 7). Accordingly, each illumination setting has a set of measurement actual positions MI, which contains the measured actual positions for each of the facets 204. The measurement actual positions MI have a greater accuracy than the sensor actual positions. This is because the measuring device 508 can capture the measurement actual positions MI without being influenced by the aforementioned interaction WW. This is ensured, in particular, by way of a measurement method of the measuring device 508 that is not subject to the interaction WW and/or by a (sufficient) distance from the optical system 500 (e.g., at least one meter). The measuring device 508 is preferably configured to capture the measurement actual positions MI optically. To this end, the measuring device 508 can be designed as an interferometer and/or deflectometer (corresponding to an interferometric and/or deflectometric measurement), for example.

In a further step (S703 in FIG. 7), a difference between the measurement actual positions MI and the intended positions SP in the form of an empirical deviation EA is formed in a comparator unit 510.

Figure 7:
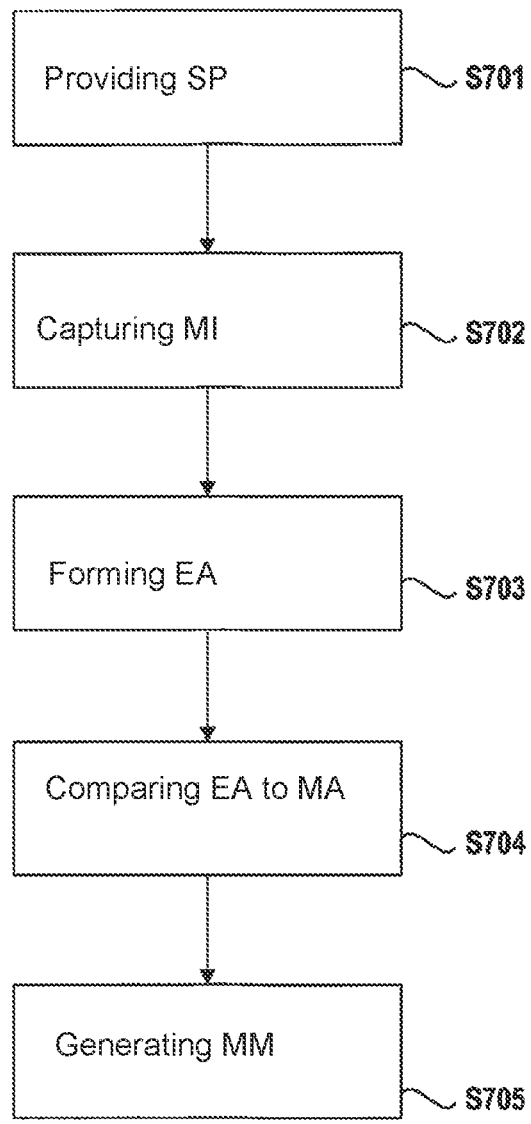
FIG. 7 shows a first flowchart of a method according to an embodiment.

The empirical deviation EA is compared to a modeled deviation MA in a comparator unit 512 (step S704 in FIG. 7). A mathematical model MM is formed in a computer and memory unit 514, for example a microprocessor with assigned memory means, from the difference between the empirical deviation EA and the modeled deviation MA (step S705 in FIG. 7).

Further, prior knowledge VW about the interactions WW which are to be expected on account of the optical design of the facet mirror 200 or the facets 204, the actuators 300, and the sensors 324 is included in the mathematical model MM—in addition to the intended positions SP. By way of example, the prior knowledge may comprise: the geometric arrangement of the facets 204, the actuators 300, and the sensor 324, typing of the components (in particular the components 204, 300, 324 including electric or optical signal lines, denoted by reference sign 516 here in exemplary fashion) on the basis of technical criteria which potentially influence the interaction behavior: e.g., orientation, wiring, signal frequencies, etc., and the set of predefined standard relative angular positions (illumination settings) of the individual facets 204, which are also supplied in the final use.

The physical and phenomenological prior knowledge VW about the interactions WW underlying the empirical deviations EA may further include: the components of the control loops 506 and the mechatronic concept (actuators 300: electromagnetic, piezoelectric, etc.; position sensors/angle sensors 324: inductive, capacitive, optical, etc.; signal lines 516, common potentials, HF generators, etc.), expected interaction mechanisms (electromagnetic: inductive/capacitive signal crosstalk, earth loops, etc., reciprocal interference of signal amplitudes, signal frequencies and signal phase angles; optical (e.g., stray light); mechanical (deformation, stresses), correlations between selected positioning parameters (e.g., intended relative angular positions SP of neighboring facets 204) and the occurring deviations EA, and identification of interaction pairs or mechanisms (e.g., sensor-sensor crosstalk, actuator-sensor crosstalk, etc.).

Figure 5B:
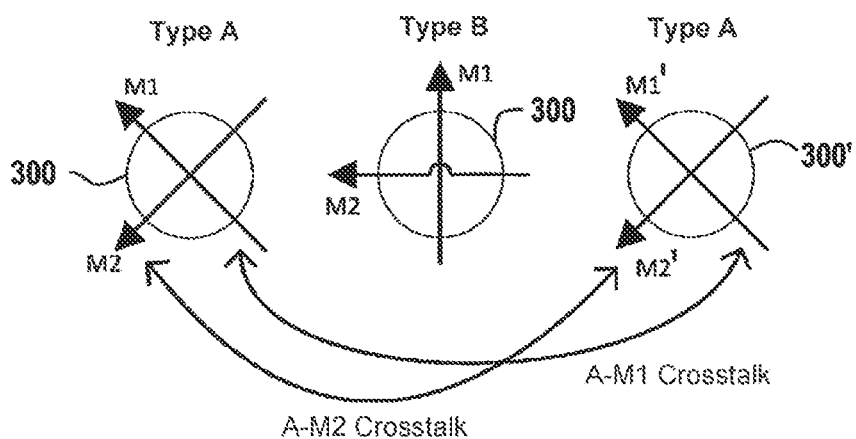
FIG. 5B shows crosstalk in the case of sensors of the same type.

An interaction WW between the control loops 506 on account of sensor-sensor crosstalk and the validity of the (linear) superposition principle in the case of a plurality of interference sources is assumed in the present exemplary embodiment. In this case, there is only signal crosstalk between sensors 324 of the same type, that is to say, in particular, with sensor axes that are oriented the same way, as illustrated on the basis of FIG. 5B (the typing and spacing of sensors of the same type from one another on its own reduces crosstalk but is often only insufficient).

Figure 5C:
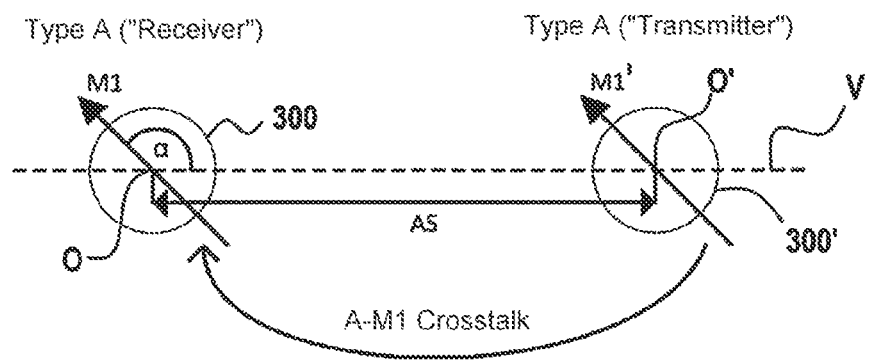
FIG. 5C shows angles between a connecting line and sensor axes.

In FIG. 2, the different types of eddy current sensors 324, 324' or the facets 204, 204' respectively assigned thereto are denoted by A and B and in this case they differ in terms of the orientation of their sensor axes M1, M2 in relation to the global coordinate system (see FIG. 5B) and in terms of the control frequencies. Moreover, the effect of crosstalk depends on the reciprocal orientation a of the sensor axes (see FIG. 5C), for example M1, M2, in relation to a connecting line V therebetween or between their respective origins O, O', and the spacing AS (in FIG. 4) of the sensors 324, 324' from one another Below, only two different sensor types are assumed for simplification purposes; they are distinguished by "1" and "2" and correspond to the types A and B from FIG. 2, for example.

In the present exemplary embodiment, the following specific, globally parameterized model is used to describe the measured deviation $\Delta T_{F,emp}$ of the actual relative angular positions of the mirror facets (index F) from the sought-after intended relative angular positions.

$$\Delta T_{F,mod}(\{T_{NFs(F)}\}, p_1, p_2, q_1, q_2, d, n, \{d_{F,NFs}\}, \{\alpha_{F,NFs}\}) = \sum_{k=\{NFs(F)\}} (p_{1|2}T_k|\sin\alpha_{F,k}| + q_{1|2}T_k|\cos\alpha_{F,k}|)\left(\frac{d}{d_{F,k}}\right)^n$$

where:
$\{T_{NFs(F)}\}$: denotes the set of all actual relative angular positions (measurement actual positions MI) of the closest facets 204 of (exclusively) the same type ("1" or "2");

$\{d_{F,NFs}\}, \{\alpha_{F,NFs}\}$: denotes the set of geometric distances AS (see FIG. 4) and reciprocal orientations $\alpha$ (see FIG. 5C) of the closest facets 204 of the same type;

d: denotes the length normalization (freely selectable parameter);

$p_1, p_2, q_1, q_2, n$: denote adaptation parameters of the model (subsumed by "parameter set PS" in FIG. 5);

F: denotes the index of the interfered with receiver facets 204;

k: denotes the interfering facets 204'; $\Delta T_{F,mod}$: denotes the modeled deviation MA of the actual relative angular position (measurement actual positions MI) of the mirror facet F from the intended relative angular position (intended positions SP);

$\{NFs(F)\}$: denotes the set of indices of the interfering facets k or 204' adjacent to the receiver facet F or 204;

$T_k$: denotes the actual relative angular position (measurement actual positions MI) of the facet k (the intended relative angular position can be assumed to a first approximation or for the first calculation iteration); and $p_{1|2}, q_{1|2}$: denotes the selection of the corresponding adaptation parameters on the basis of the type of the interacting facets F and $\{NFs(F)\}$.

This is now followed by the numerical optimization of the mathematical model MM. The following adaptation parameters should be optimized: $p_1, p_2, q_1, q_2, n$. By way of example, this is implemented with the aid of a numerical optimization, in particular with a least-squares minimization (method of least squares). The object is for the empirical deviation EA to be approximated to the best possible extent by the modeled deviation MA—that is to say the difference between these is made to tend to 0.

$$\min_{p_1, p_2, q_1, q_2, n} \left( \sum_{F=\{Fs\}} (\Delta T_{F,emp} - \Delta T_{F,mod}(\{T_{NFs(F)}\}, p_1, p_2, q_1, q_2, d, n, \{d_{F,NFs}\}, \{\alpha_{F,NFs}\}))^2 \right)$$

Expressed differently, the modeled deviation MA itself emerges from the mathematical model MM and the difference from the empirical deviation EA is used to improve the mathematical model (i.e., a fit loop is implemented).

For each illumination setting set, the model supplies predictions $\{\Delta T_{F,mod}\}$ for the expected deviations EA of the actual relative angular positions (measurement actual positions SP) from the set intended relative angular positions (intended positions SP) of all facets 204.

These predictions can be used to accordingly correct the control values (SP), which are specified in the control unit 504. This correction should be realized as an iterative process IP since the calculated deviations themselves represent a function of the intended relative angular positions (intended positions SP) of the facets 204. Fast convergence should be expected in practice since the ratio of angular deviations to intended relative angular positions is in the region of <1%.

Figure 8:
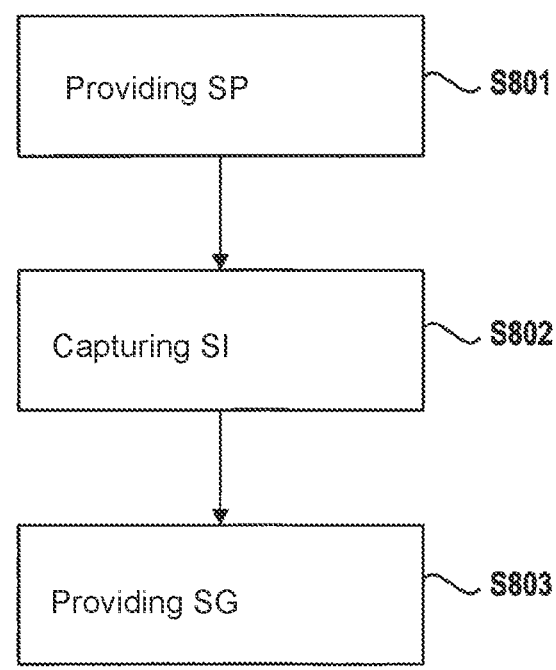
FIG. 8 shows another flowchart of a method according to a further embodiment.

How the mathematical model MM can now be used to facilitate improved closed-loop control of the positions of the facets 204 at the customer is explained in more detail below with reference to FIGS. 6 and 8.

FIG. 6 shows an optical system 500 that has been supplied to a customer, for example for one of the lithography apparatuses 100A, 100B from FIGS. 1A and 1B for the manufacture of integrated circuits.

In comparison with the optical system 500 described in relation to FIG. 5, a correction unit 600, which is designed as a microprocessor with an associated memory for example, has additionally been integrated into the optical system 500. The mathematical model MM, together with the ascertained parameter set PS, is stored in the memory. The correction unit 600 is preferably already provided at the manufacturer of the optical system 500.

For the purposes of exposing a wafer 124 (see FIGS. 1A and 1B) the customer chooses a suitable illumination setting, in particular even a setting that was unknown to the manufacturer at the time of manufacture of the optical system 500. As already explained above, the illumination setting comprises a set of intended positions SP of the facets 204. The adjustment unit 502 provides the corresponding intended positions SP for the correction unit 600 (step S801 in FIG. 8).

In a step S802 (see FIG. 8) the correction unit 600 corrects the intended positions SP with the aid of the mathematical model MM together with the parameter set PS and outputs calibrated intended positions KS to the controller unit 504.

In a step S803, the control unit 504 provides the manipulated variables SG on the basis of the calibrated intended positions KS and the sensor actual positions SI captured by the sensors 324.

However, this is only one exemplary embodiment. The correction or calibration could also be implemented at a different point. By way of example, the correction unit 600 could be provided between the sensors 324 and the control unit 504 or else on the control unit 504 and could, with the aid of the mathematical model MM and the parameter set PS, calibrate or correct the sensor actual positions SI provided by the sensors 324. In particular, the correction unit 600 can also be integrated in the facet mirror 200.

With the aid of this calibration method it is possible to significantly reduce the deviations between the intended positions SP (intended relative angular positions) and the measurement actual positions MI (actual relative angular positions), which deviations depend on the illumination setting set. Thus, using the mathematical model explained above, the 3-times standard deviation of these (angular) deviations can be reduced by at least 25% to values<250 µrad in embodiments. Even improvements by at least a factor of 2 can be obtained using more detailed models.

As a result of the procedure described above, it is possible in particular to predict and correct the deviations occurring as a result of interactions between the various control loops 506 of the facet control and occurring between the actual relative angular positions MI of the facets 204 of a facet mirror 200 and the intended relative angular positions SP specified by the illumination setting, without being dependent on a comprehensive measurement of all conceivable illumination settings.

Although the present invention has been described on the basis of exemplary embodiments, it can be modified in various ways.

In particular, further configurations are conceivable when forming the model:

Mathematical models MM and associated parameter sets PS which contain nonlinear terms and/or mix different axes M1, M2 should these be present in the specific configuration of a control loop element, for example the sensors 324, 326, as illustrated below: "nonlinear terms": e.g., $\Delta T_{F, mod} \sim T_k^2, T_k^3$; "mix different axes M1, M2": e.g., $\Delta T_{F, M1, mod} \sim T_{k,M1}, T_{k,M2}^2$, that is to say despite the fact that only the same axes (in this example M1) interact with one another, the angle position of the other axis (in this example M2 of the interfering element) can nevertheless have an influence on the absolute value of the interaction.

Mathematical models MM and associated parameter sets PS which model and adapt the various interfered-with facets 204 independently of one another and/or treat the various interfering facets 204' or the control loop elements thereof independently of one another in the modeling (local parameterization). An exemplary formula would be:

$$\begin{cases} \Delta T_{FF,X}(\{T\}_{NFFs(FF)}, \{c\}_{X,NFFs(FF)}) = \sum_{n=\{NFFs\}} c_{FF,n,X} T_{n,X} \\ \Delta T_{FF,Y}(\{T\}_{NFFs(FF)}, \{c\}_{Y,NFFs(FF)}) = \sum_{n=\{NFFs\}} c_{FF,n,Y} T_{n,Y} \end{cases}$$

that is to say independent fits are carried out for both sensor axes (X, Y) and all "receiver" facets (index FF), which fits influence the respective neighboring facets NFFs(FF) (and the relevant sensor axis thereof) with independent fit parameters CFF,n,X/Y.

Mathematical models MM and associated parameter sets PS which model and adapt the various discrete positions (relative angular positions), selected during the operation, of the interfered-with facets 204 independently of one another.

LIST OF REFERENCE SIGNS

100A EUV lithography apparatus
100B DUV lithography apparatus
102 Beam-shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200 Facet mirror
202 Support plate
204, 204' Facets
300, 300' Voice coil actuators
302 Securing sleeve
306 Flexure
308 Leg
312 Actuating rod
314, 314' End pieces
316 Tilt point
318 Separating surface
320, 320' Coils
322, 322' Coils
324, 324' Sensors
326, 326' Sensors
500 Optical system 502 Adjustment unit
504 Controller unit
506 Control loop
508 Measuring device
510 Comparator unit
512 Comparator unit
514 Computer and memory unit
516 Signal line
600 Correction unit
A, B Types
AS Distance
EA Empirical deviation
IP Iterative process
KS Calibrated intended position
$M_1$, $M_2$, $M_3$ Center axes
M1 Mirror
M2 Mirror
M3 Mirror
M4 Mirror
M5 Mirror
M6 Mirror
MA Modeled deviation
MI Measurement actual positions
MM Mathematical model
O,O' Origin
P Arrow
PS Parameter set
S701-S705 Steps
S801-S803 Steps
SG Manipulated variable
SI Sensor actual positions
SP Intended positions
U Field line
V Connecting line
VW Prior knowledge
WW Interaction
x Axis
y Axis
α Orientation

What is claimed is:

1. A method for an optical system, the optical system comprising:
  a facet mirror with individual mirrors,
  actuators which are configured to position the individual mirrors in accordance with manipulated variables,
  sensors which are configured to capture sensor actual positions of the individual mirrors,
  an adjustment unit which is configured to provide intended positions of the individual mirrors, and
  a controller unit which is configured to provide the manipulated variables in accordance with the provided intended positions and the captured sensor actual positions, and
  the method comprising:
  a) providing the intended positions of the individual mirrors with the adjustment unit,
  b) capturing measurement actual positions of the individual mirrors with a measuring device,
  c) generating a mathematical model for positioning the individual mirrors in accordance with the captured measurement actual positions and the intended positions,
  wherein a difference between a respective measurement actual position and a respective intended position is formed in said step c) and the mathematical model is generated in accordance with the difference formed, and
  d) positioning the individual mirrors of the facet mirror in accordance with the mathematical model.

2. The method as claimed in claim 1, wherein the measuring device comprises at least one of an interferometer, a deflectometer and a camera.

3. The method as claimed in claim 1, wherein the optical system comprises at least two components, and wherein said step c) comprises inputting an interaction between the at least two components into the mathematical model.

4. The method as claimed in claim 3, wherein the interaction is crosstalk.

5. The method as claimed in claim 3, wherein the at least two components comprise at least one of: two sensors, two actuators, one actuator and one sensor, and electrical and/or optical connections or components of the sensors or actuators.

6. The method as claimed in claim 1, wherein the optical system comprises a plurality of respective types of the individual mirrors, and wherein said step c) comprises inputting properties of only the individual mirrors of the same respective type into the mathematical model and/or properties of actuators and/or sensors assigned to the individual mirrors of the same respective type.

7. The method as claimed in claim 6, wherein the properties include an orientation of and/or a distance of the individual mirrors of the same respective type or of the actuators and/or the sensors assigned to the individual mirrors of the same respective type.

8. The method as claimed in claim 1, wherein said step c) comprises generating the mathematical model iteratively.

9. The method as claimed in claim 1, wherein said step c) comprises generating the mathematical model through a numerical process.

10. The method as claimed in claim 9, wherein the numerical process comprises a method of least squares.

11. The method as claimed in claim 1, wherein the measuring device captures the measurement actual positions optically.

12. The method as claimed in claim 1, wherein the sensor actual positions, the measurement actual positions and the intended positions are relative angular positions of the individual mirrors.

13. A method for an optical system, the optical system comprising:
  a facet mirror with individual mirrors,
  actuators which are configured to position the individual mirrors in accordance with manipulated variables,
  sensors which are configured to capture sensor actual positions of the individual mirrors,
  an adjustment unit which is configured to provide intended positions of the individual mirrors, and
  a controller unit which is configured to provide the manipulated variables in accordance with the provided intended positions, the captured sensor actual positions and a mathematical model,
  the method comprising:
  a) providing the intended positions of the individual mirrors with the adjustment unit,
  b) capturing the sensor actual positions of the individual mirrors with the sensors,
  c) providing the manipulated variables in accordance with the provided intended positions, the captured sensor actual positions and the mathematical model with the control unit, and
  d) positioning the individual mirrors of the facet mirror in accordance with the mathematical model.

14. The method as claimed in claim 13, wherein the intended positions provided by the adjustment unit are calibrated with the mathematical model to provide calibrated intended positions, and wherein the controller unit provides the manipulated variables in accordance with the calibrated intended positions and the captured sensor actual positions.

15. An optical system, comprising:
    a facet mirror with individual mirrors,
    actuators which are configured to position the individual mirrors in accordance with manipulated variables,
    sensors which are configured to capture sensor actual positions of the individual mirrors,
    an adjustment unit which is configured to provide intended positions of the individual mirrors, and
    a controller unit which is configured to provide the manipulated variables in accordance with the provided intended positions, the captured sensor actual positions and a mathematical model, wherein the mathematical model is generated as according to the method claimed in claim 1.

16. A lithography apparatus, comprising an optical system as claimed in claim 15.

* * * * *

UNITED STATES PATENT AND TRADEMARK OFFICE
CERTIFICATE OF CORRECTION

PATENT NO. : 12,164,102 B2
APPLICATION NO. : 17/524080
DATED : December 10, 2024
INVENTOR(S) : Kretzschmar et al.

It is certified that error appears in the above-identified patent and that said Letters Patent is hereby corrected as shown below:

In the Specification

Column 11, Line 42, delete "a of the sensor axes" and insert -- $\alpha$ of the sensor axes --

Signed and Sealed this
Thirteenth Day of May, 2025

Coke Morgan Stewart
*Acting Director of the United States Patent and Trademark Office*